United States Patent [19]

Sato

[11] Patent Number: 4,858,175
[45] Date of Patent: Aug. 15, 1989

[54] MONOLITHIC SEMI-CUSTOM IC HAVING STANDARD LSI SECTIONS AND COUPLING GATE ARRAY SECTIONS

[75] Inventor: Kazuyuki Sato, Tokyo, Japan

[73] Assignee: Kabushiki Kaisha Toshiba, Kawasaki, Japan

[21] Appl. No.: 780,795

[22] Filed: Sep. 27, 1985

[30] Foreign Application Priority Data

Sep. 29, 1984 [JP] Japan .................. 59-204455
Sep. 29, 1984 [JP] Japan .................. 59-204456
Sep. 29, 1984 [JP] Japan .................. 59-204462

[51] Int. Cl.⁴ .................. G06F 1/00; H01L 27/10
[52] U.S. Cl. .................. 364/900; 357/45; 364/925.5; 364/927.8
[58] Field of Search ... 364/200 MS File, 900 MS File, 364/490, 491, 488, 489; 307/303, 465; 357/40, 45, 51

[56] References Cited

U.S. PATENT DOCUMENTS

| | | | |
|---|---|---|---|
| 4,155,118 | 5/1979 | Lamiaux | 364/712 |
| 4,191,996 | 3/1980 | Chesley | 364/200 |
| 4,295,149 | 10/1981 | Balyoz | 357/45 |
| 4,447,881 | 5/1984 | Brantingham et al. | 364/490 |
| 4,500,906 | 2/1985 | Ohno et al. | 357/40 X |
| 4,549,131 | 10/1985 | Kusazaki | 357/51 X |
| 4,575,744 | 3/1986 | Caldwell et al. | 357/45 |
| 4,584,653 | 4/1986 | Chih et al. | 364/488 |
| 4,600,995 | 7/1986 | Kinoshita | 364/491 |
| 4,628,343 | 12/1986 | Komatsu | 357/40 X |
| 4,646,126 | 2/1987 | Iizuka | 357/51 |
| 4,688,070 | 8/1987 | Shiotari et al. | 357/40 |
| 4,727,493 | 2/1988 | Taylor | 364/488 |

*Primary Examiner*—Raulfe B. Zache
*Assistant Examiner*—Florin Munteanu-r
*Attorney, Agent, or Firm*—Finnegan, Henderson, Farabow, Garrett, & Dunner

[57] ABSTRACT

In a monolithic semi-custom LSI, different types of standard LSI logic sections, each having a predetermined logic configuration and wiring pattern, and each serving as an independent LSI chip; glue circuits such as an SSI and an MSI which have design standards suitable for the same process conditions as those of the standard LSI logic sections, and which constitute a peripheral circuit section of the standard LSI logic sections; a mask pattern section having a wiring region for arbitrarily connecting terminals of the standard LSI logic sections and the peripheral circuit section, and a bonding pad section formed to surround the standard LSI logic sections and the peripheral circuit section to connect them to lead wires, are arranged to minimize the chip size. These constituting elements constitute common hardware as a master. The elements are connected through a single- or multi-layer wiring pattern.

4 Claims, 5 Drawing Sheets

F I G. 3
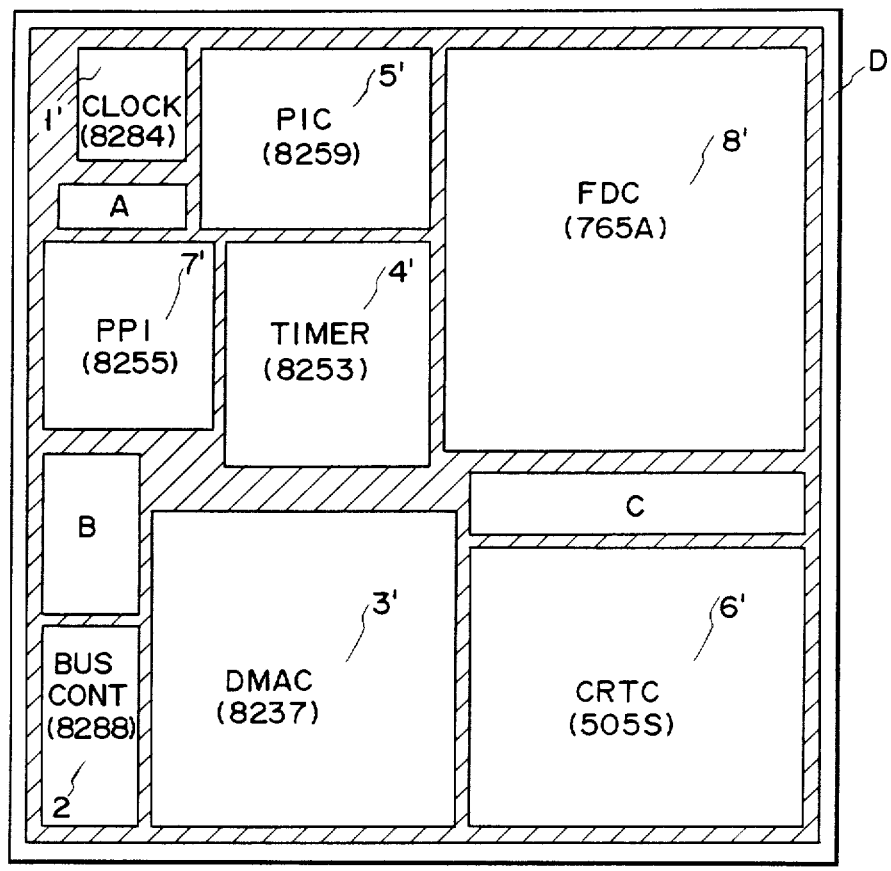

F I G. 5
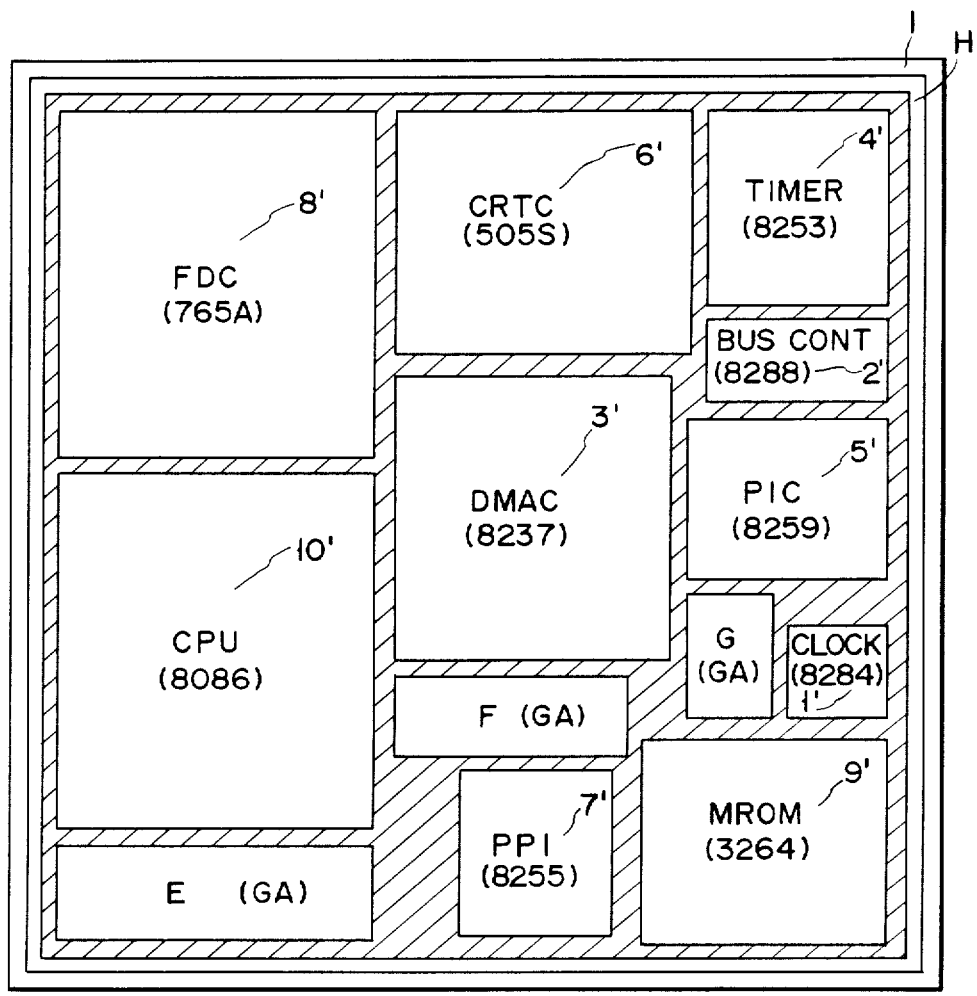

MONOLITHIC SEMI-CUSTOM IC HAVING STANDARD LSI SECTIONS AND COUPLING GATE ARRAY SECTIONS

BACKGROUND OF THE INVENTION

The present invention relates to a monolithic semi-custom LSI having a plurality of standard LSI logic sections, each of which is capable of functioning as an independent LSI having a predetermined logic configuration and wiring pattern, a gate array constituting a peripheral circuit of the standard LSI logic sections, and a mask ROM for controlling the logic sections and the gate array.

LSI design techniques represented by a gate array design technique have been simplified. By using these techniques, LSI system design, conventionally confined to semiconductor engineers, can now be easily performed by engineers in other fields. Thus, more systems utilizing LSIs and low-profile compact systems are being developed.

Microcomputers and their LSI family have become popular, and miscellaneous circuits, called glue circuits, which are separate from microcomputers and their peripheral LSI family, are now subject to LSI configuration. This is because a large-scale circuit such as a microcomputer or its LSI family cannot be incorporated in a gate array or a standard cell. The most compact hardware configuration of a logic circuit is given by a system of "microcomputer+peripheral family chips+gate arrays or standard cells". It is difficult to achieve further integration and compactness of logic circuits.

FIG. 1 is a block diagram showing a system configuration in accordance with a conventional LSI technique. Functional blocks 30 through 69 are constituted by independent logic elements (i.e., semiconductor chips).

The system of FIG. 1 has a CPU 30, oscillators 31A and 50A, a clock generator (C-G) 31B, a bus controller (BUS-CONT) 32, DMA controllers (DMA-CONT) 33 and 34, latches (LATCH) 35, 40, 47, 48 and 54; a timer (TMR) 36, an interrupt controller (PIC) 37, mask ROMs (MROM) 38 and 45, a RAM 39, dynamic RAMs (D-RAM) 41 and 46, a D-RAM controller (DRAM-CONT) 42, glue circuits 43 and 49, a CRT miscellaneous circuit (GA-CRT) 43 and a CPU miscellaneous circuit (GA-CPU) 49 constituted respectively by gate arrays (GA), a CRT controller (CRTC) 44, a PLL circuit (PLL) 50B, a floppy disk controller (FDC) 51, a floppy disk interface (FDD-IF) 52, a register (REG) 53, a video driver (VIDEO-OUTPUT) 55, drivers (DRV) 57, 58, 59, 60 and 63; a parity generator (PAR-G) 61, drivers/receivers (D/R) 62, 64, 65, 66 and 67; a keyboard/speaker interface (KB-SPK-SW) 68, a numerical data processor 69, and connector pin junctions PJ1, PJ2, and PJ4 through PJ11. Chip model numbers are indicated in parentheses in FIG. 1.

In a conventional system, since the functional circuits 30 through 69 are constituted respectively by independent logic circuit elements (semiconductor chips), design flexibility can be achieved to some extent, but system hardware can be made neither compact nor simplified, resulting in inconvenience.

SUMMARY OF THE INVENTION

It is an object of the present invention to provide a highly integrated monolithic semi-custom LSI.

In order to achieve the above object of the present invention, there is provided a monolithic semi-custom system, large scale integration (LSI) circuit comprising:

different types of standard LSI logic sections each having a predetermined logic configuration and wiring pattern;

a peripheral circuit section for the standard LSI logic sections which has a design standard suitable for the same process conditions as those of the standard LSI logic sections;

a wiring region for arbitrarily connecting terminals between the standard LSI logic sections and the peripheral circuit section; and a bonding pad section formed to surround the standard LSI logic sections and the peripheral circuit section so as to connect the terminals to lead wires, wherein the standard LSI logic sections, the peripheral circuit section, the wiring region and the bonding pad section constitute common hardware as a master, and the standard LSI logic sections, the peripheral circuit section, the wiring region and the bonding pad section are connected to each other through single- or multi-layer pattern wiring.

BRIEF DESCRIPTION OF THE DRAWINGS

Other objects and features of the present invention will be apparent from the following description taken in connection with the accompanying drawings, in which:

FIG. 3 is a plan view showing functional blocks of the system of FIG. 2;

FIG. 5 is a plan view showing functional blocks of the system when the mask ROMs are integrated in the system of FIG. 4.

DETAILED DESCRIPTION OF THE PREFERRED EMBODIMENT

Figure 2:
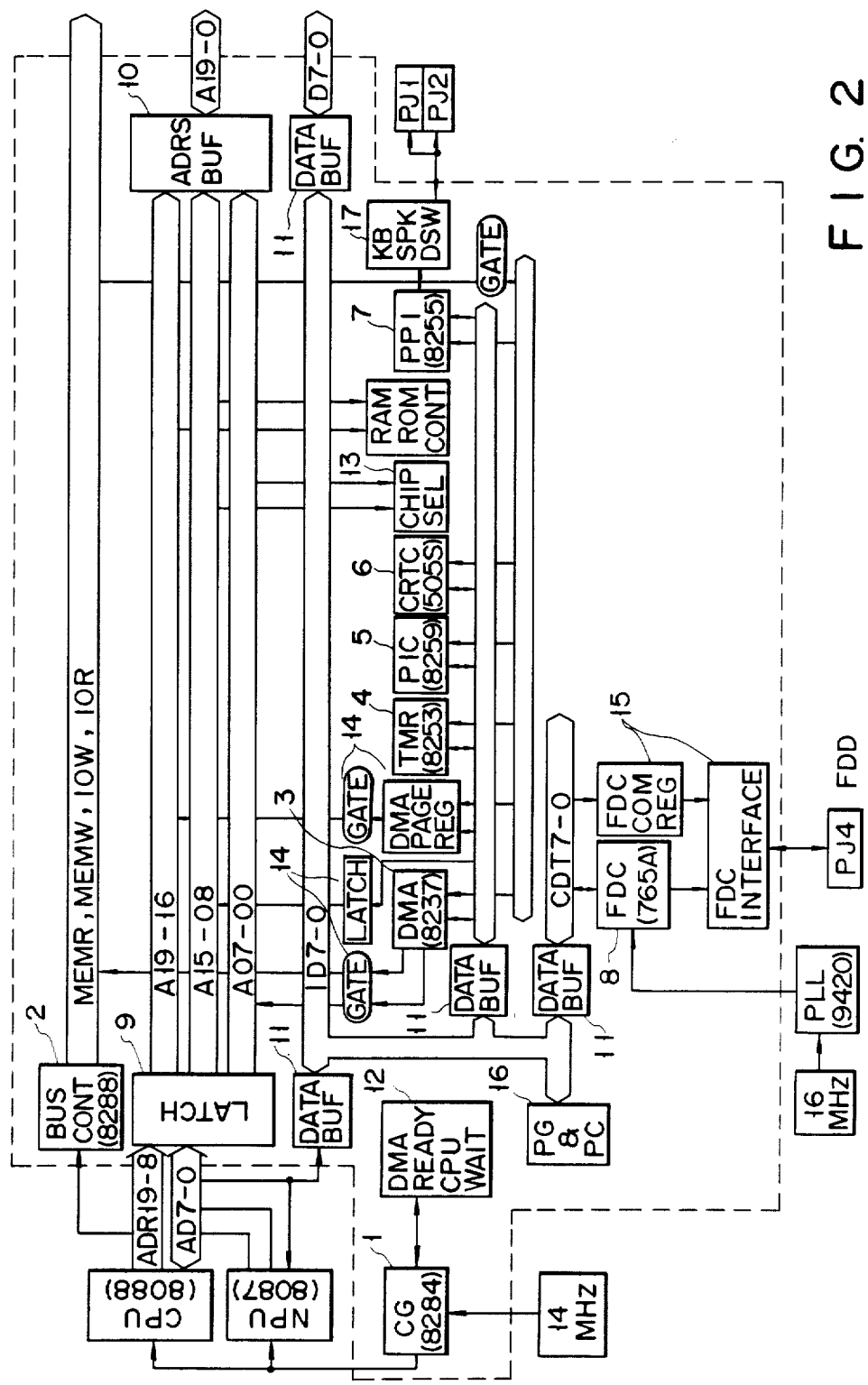
FIG. 2 is a block showing a system configuration according to an embodiment of the present invention.

Referring to FIG. 2, the region surrounded by the broken line represents an internal hardware logic of interest which is integrated according to the present invention. This logic comprises a microcomputer peripheral LSI, a bus control logic, an interface logic, an address latch, data driver/receiver or the like. The microcomputer peripheral LSI has a clock generator (C-G: an equivalent of an 8284 available from Intel Corp., U.S.A.) 1, a bus controller (BUS CONT: an equivalent to an 8288 available from Intel Corp., U.S.A.) 2, a DMA controller (DMA: an equivalent to an 8237 available from Intel Corp., U.S.A.) 3, a timer (TMR: an equivalent to an 8253 available from Intel Corp., U.S.A.) 4, an interrupt controller (PIC: an equivalent to an 8259 available from Intel Corp., U.S.A.) 5, a CRT controller (CRTC: an equivalent to a 46505S available from Intel Corp., U.S.A.) 6, a programmable peripheral interface (PPI: an equivalent to an 8255 available from Intel Corp., U.S.A.) 7, and a floppy disk controller (FDC: an equivalent to a 756A available from Intel Corp., U.S.A.) 8. Additional peripheral circuits of the microcomputer peripheral LSI are an address latch (LATCH) 9, an address buffer (ADRS BUS) 10, a data bus driver/receiver (DATA BUF) 11, a DMA bus/CPU bus timing controller (DMA READY.CPU WAIT) 12, a peripheral LSI memory chip select logic (CHIP SEL) 13, a DMA interface (DMA PAGE REG, GATE, LATCH) 14, an FDC interface (FDC COM REG, FDC INTERFACE) 15, a parity generation/check circuit (PG & PC) 16, a keyboard/speaker interface (KB SPK DSW) 17, and so on.

FIG. 3 is a plan view showing the actual functional blocks of an object of interest of FIG. 2. Standard LSI logic sections 1' through 8' of FIG. 3 have logic arrangements and wiring patterns which serve as independent LSI chips corresponding to blocks 1 through 8 of FIG. 2. Glue circuits (SSI/MSI logic section) A, B and C in FIG. 3 have the same logic functions as combinations of gates, flip-flops, registers and resistors of the SSI and MSI of FIG. 2, which correspond to the SSI and MSI of FIG. 1. The circuit A corresponds to the interface 17 and the clock frequency divider in FIG. 2, the circuit B corresponds to the latch 9, the buffer 10, the driver/receiver 11, the controller 12, the logic 13 and the circuit 16 in FIG. 2; and the circuit C corresponds to the interfaces 14 and 15 in FIG. 2. A block D represents a pad area for connecting external lead wires.

The sections 1' through 8' have the same patterns and logic functions as those of commercially available independent LSIs, and are rated in the same manner thereas. The sections 1' through 8' are standardized by the same design standards. A gate length, a line width and a gate oxide film thickness comply with identical process parameters. A region corresponding to a conventional individual LSI pad, and a region corresponding to external terminals are small enough to lead the wiring out. The number of wiring layers of each of the sections 1' through 8' is identical. More specifically, an aluminum (Al) single layer is used as the wiring layer.

Figure 1:
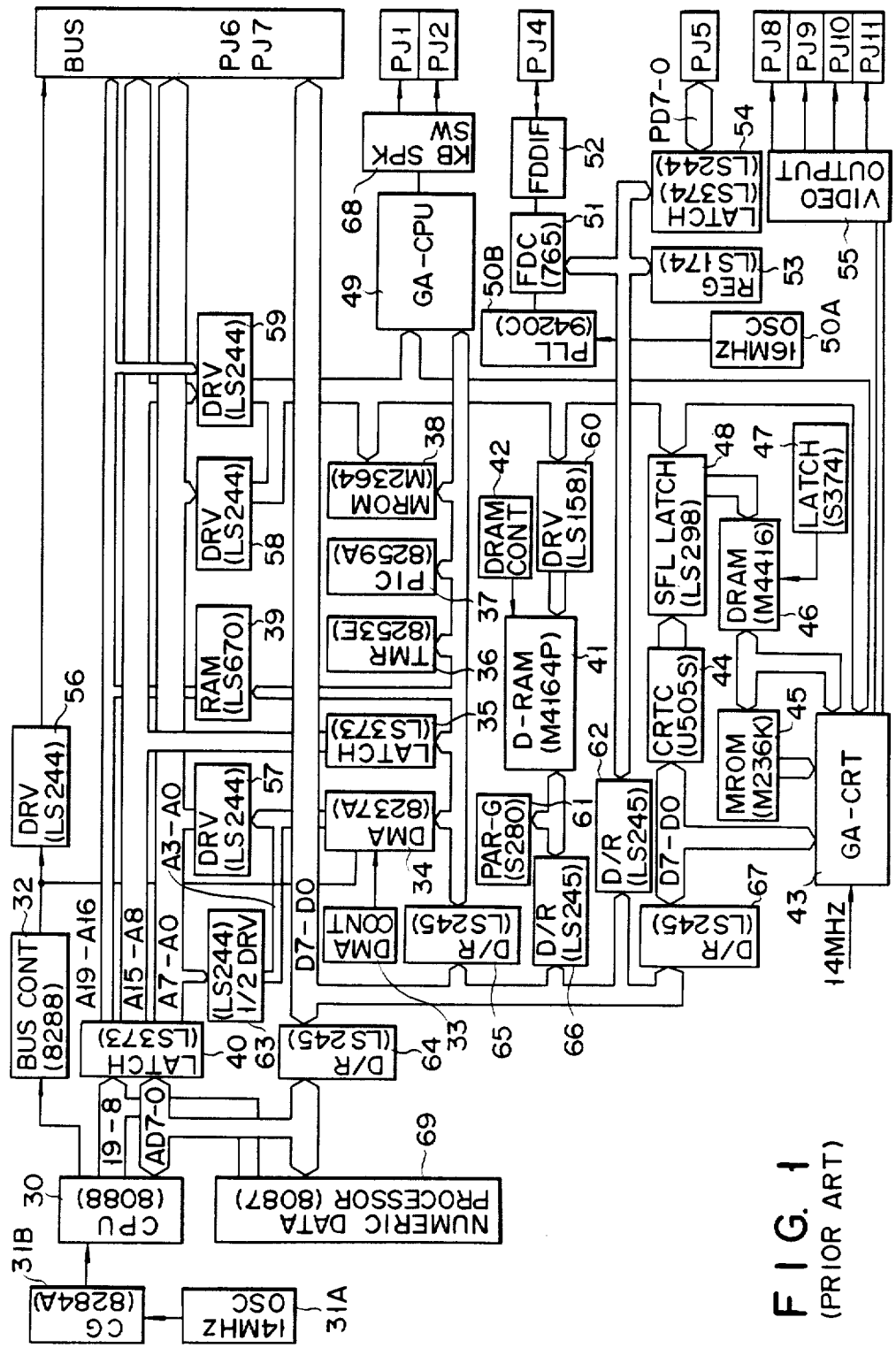
FIG. 1 is a block diagram showing a system configuration according to conventional LSI techniques.

The same gates, flip-flops, registers and resistors as the SSIs and MSIs of FIGS. 1 and 2 are arranged to provide the same patterns, logic functions and performance as those of the conventional standard ICs (SSI/MSI) in the circuits A, B and C. The circuits A, B and C have the same design standards as those of the sections 1' through 8'. The pad area is small enough to lead the wiring out therefrom, and the number of wiring layers in each SSI and MSI is identical. More specifically, an Al single layer is used as the wiring layer.

The pad area D has the necessary number of external wiring pads.

The blocks 1' through 8' and A through D are arranged to minimize the chip size and serve as a common master on a single wafer, as shown in FIG. 3.

System engineers use a first Al wiring region (a portion corresponding to a gap between two adjacent chips) and a second Al wiring region (an entire area of the chip) with the LSIs described above. The LSIs (1' through 8') and patterns of the SSI and MSI are mutually connected, thereby implementing a monolithic LSI of a desired system configuration at the same level as the conventional printed circuit board design.

Figure 4:
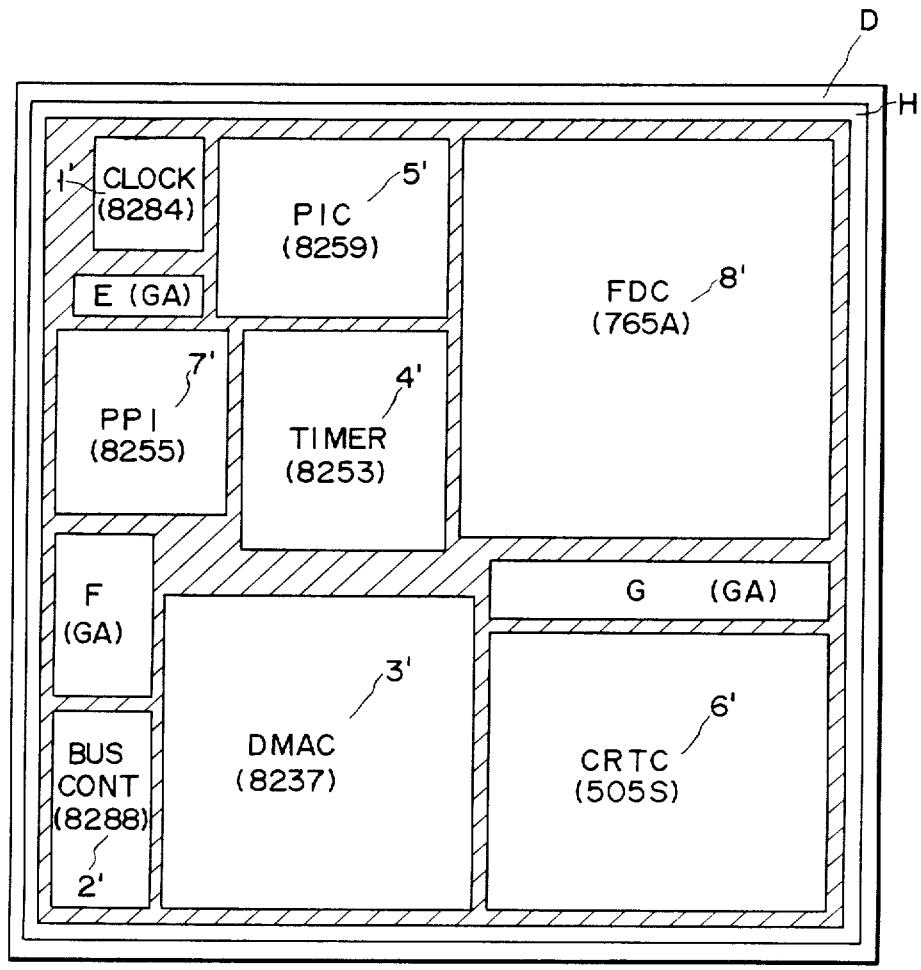
FIG. 4 is a plan view showing functional blocks of the system when the gate blocks are integrated in the system of FIG. 3.

FIG. 4 shows another embodiment of the present invention. In this embodiment, reference symbols E through H denote gate array (GA) blocks, respectively. The block E has the interface 17 and the clock frequency divider in FIG. 2, the block F has the latch 9, the buffer 10, the driver/receiver 11, the controller 12, the logic 13, the circuit 16 and so on in FIG. 2; the block G has the interfaces 14 and 15 in FIG. 2, and the block H serves as an I/O buffer area for the external interface. Reference symbol D denotes an external connection pad area.

The blocks E, F and G have different scales and the same design standards as the sections 1' through 8'. The blocks E, F and G do not have pads. One or two Al wiring layers are used in the blocks E, F and G to constitute circuits with gates and flip-flops. The block H serves as an I/O buffer for interfacing blocks E, F and G, the sections 1' through 8' and an external device of the LSI.

System engineers, using the above LSIs, design the glue circuits by gate arrays (i.e., the gate array blocks E, F, G and H) within the limits of the region of interest (indicated by the broken line) of FIG. 2. The glue circuits are connected to the sections 1' through 8' through the first Al wiring region (between the adjacent LSI logic sections and the first wiring regions of the gate array blocks) and the second Al wiring region (the entire area of the chips). As a result, a monolithic LSI of a desired system configuration can be implemented at the same level as in a conventional printed circuit board design.

A plurality of LSI blocks and gate array (GA) blocks which have the same design standards and ratings as described above are optimally mounted on a single wafer, and the resultant structure constitutes common hardware (master). The first and second A( wiring layers are freely designed in a design chart to minimize the chip size, thereby providing a semi-custom LSI which satisfies different systems. The operation required during the process is Al wiring, so that the manufacturing time can be greatly shortened. Since the LSI peripheral circuits are constituted by the gate arrays, system compatibility can be easily realized.

In this embodiment, the gate arrays are mounted except for the standard LSI logics. However, the gate array may be combined with other elements such as a resistor module.

FIG. 5 shows still another embodiment of the present invention. A system of this embodiment additionally has a CPU block 10' and a mask ROM 9' as compared with the embodiment of FIG. 4.

The ROM 9' comprises a mask ROM (MROM) corresponding to the mask ROM 18 of FIG. 2, and has a memory capacity of 8 bits×8 kbits=64 kbits. The ROM 18 has the same design standards as in the sections 1' through 8', and a region corresponding to the conventional pad is small enough to lead the wiring out therefrom.

A data pattern of the mask ROM 9' is determined by contact hole positions or a threshold level by means of ion implantation. Data is written in the ROM 9' in accordance with the contact or threshold write technique.

A gate array block I serves as an I/O buffer for interfacing the gate array blocks E, F and G, the LSI logic sections 1' through 8', the ROM 9' and the external device of the LSI.

System engineers using the LSIs described above design the glue circuits by the gate arrays (i.e., the gate array blocks E, F, G and H) within the region of interest (indicated by the broken line in FIG. 2). The mutual connections of the sections 1' through 8' and the mask ROM 9' are accomplished by using the first Al wiring region (the regions between the respective logic sections and the first layer wiring regions of the gate array blocks) and the second Al wiring region (the entire area of the chips). The ROM 9' is programmed in accordance with the contact pattern or ion implantation (i.e., a threshold voltage level), thereby providing a monolithic LSI of a desired system configuration at the same level as the conventional printed circuit board design.

A plurality of LSI blocks having the identical design standards and ratings as described above, a mask ROM and the gate arrays (GA) are optimally arranged on a single wafer to constitute common hardware as a master. The first and second Al wiring layers are used to perform the above-mentioned mutual connections and connections of the gate arrays. The contact hole or threshold level write technique of the mask ROM is freely designed in a design chart to minimize the chip size, so that a semi-custom LSI compatible with different systems can be provided. Only Al wiring is required during the process, and thus the manufacturing period can be greatly shortened. The LSI peripheral circuits are implemented by the gate arrays, thereby realizing flexible system compatibility.

Since the system incorporates the mask ROM, it can be easily programmed, and a chip program test can be easily performed.

What is claimed is:

1. A monolithic semi-custom system, large scale integration (LSI) circuit comprising:
    a plurality of different types of standard LSI logic sections, each having a predetermined off-the-shelf logic configuration and wiring pattern;
    glue circuit means for functionally coupling said standard LSI logic sections, said glue circuit means having a mask design standard suitable for the same manufacturing process conditions as the manufacturing process conditions of said standard LSI logic sections;
    a wiring region for selectively connecting terminals between said standard LSI logic sections and said glue circuit means; and
    a bonding pad section surrounding said standard LSI logic sections and said glue circuit means for connecting said terminals to lead wires,
    wherein said standard LSI logic sections, said glue circuit means, said wiring region and said bonding pad section constitute common hardware as a master, and said standard LSI logic sections, said glue circuit means, said wiring region and said bonding pad section are connected to each other through a selected one or both of single- and multi-layer wiring pattern.

2. A circuit according to claim 1, wherein said glue circuit means comprises a small scale integration pattern, a medium scale integration pattern and a resistor pattern.

3. A monolithic semi-custom system, large scale integration circuit (LSI), comprising:
    a plurality of different types of standard LSI logic sections, each having a predetermined off-the-shelf logic configuration and wiring pattern;
    at least one gate array block having mask design standards suitable for the same manufacturing process conditions as the manufacturing process conditions of said different types of standard LSI logic sections, and constituting glue circuit means for functionally coupling said different types of standard LSI logic sections;
    a wiring region for selectively connecting terminals of each of said different types of standard LSI logic sections and terminals of said gate array block;
    an input/output buffer gate array for an external connection interface, said gate array surrounding said standard LSI logic sections and said gate array block; and
    a bonding pad section surrounding said input/output buffer gate array for connecting said terminals to lead wires,
    wherein said standard LSI logic sections, said at least one gate array block, aid wiring region, said input/output buffer gate array and said bonding pad section constitute common hardware as a master, and said standard LSI logic section, said at least one gate array block, said wiring region, said input/output buffer gate array and said bonding pad section are connected through a selected one or both of single- and multi-layer wiring pattern.

4. A monolithic semi-custom system, large scale integration (LSI) circuit, comprising:
    a plurality of different types of standard LSI logic sections, each having a predetermined off-the-shelf logic configuration and wiring pattern;
    at least one gate array block having mask design standards suitable for the same manufacturing process conditions as the manufacturing process conditions of said different types of standard LSI logic sections, and constituting glue circuit means for functionally coupling said different types of standard LSI logic sections;
    a mask read only memory (MROM) which has design standards suitable for the same manufacturing process conditions as those of said different types of standard LSI logic sections and said gate array block, and which is programmed in accordance with a contact hole threshold level write technique so as to operate a desired functional circuit of said standard LSI logic sections and said gate array block;
    an input/output buffer gate array for an external connection interface, said gate array surrounding said standard LSI logic sections and said gate array block; and
    a bonding pad section surrounding said input/output buffer gate array for connecting said terminals to lead wires,
    wherein said standard LSI logic sections, said at least one gate array block, said MROM, said input/output buffer gate array and said bonding pad section constitute common hardware as a master, and said standard LSI logic sections, said at least one gate array block, said MROM, said input/output buffer gate array and said bonding pad section are connected through a selected one both of single- and multi-layer wiring pattern.

* * * * *